(12) United States Patent
Yaguchi (10) Patent No.: US 7,107,172 B2
(45) Date of Patent: Sep. 12, 2006

(54) TEST APPARATUS AND SETTING METHOD THEREFOR

(75) Inventor: Takeshi Yaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/857,818

(22) Filed: Jun. 1, 2004

(65) Prior Publication Data

US 2004/0220763 A1 Nov. 4, 2004

Related U.S. Application Data

(63) Continuation of application No. PCT/JP04/03456, filed on Mar. 16, 2004.

(30) Foreign Application Priority Data

Mar. 19, 2003 (JP) ............................. 2003-074898

(51) Int. Cl.
G06F 19/00 (2006.01)

(52) U.S. Cl. ...................... 702/120; 702/123; 702/124; 324/527; 324/555

(58) Field of Classification Search ............ 702/57–59, 702/64, 108, 117–121, 123, 124; 324/500, 324/512, 522, 523, 527, 555; 340/514, 515, 340/635, 653

See application file for complete search history.

(56) References Cited

U.S. PATENT DOCUMENTS

| | | | |
|---|---|---|---|
| 4,070,565 A * | 1/1978 | Borrelli | 714/734 |
| 5,390,129 A * | 2/1995 | Rhodes | 702/118 |
| 5,805,610 A | 9/1998 | Illes et al. | |
| 6,557,128 B1 * | 4/2003 | Turnquist | 714/724 |
| 6,567,941 B1 * | 5/2003 | Turnquist et al. | 714/724 |
| 6,885,961 B1 * | 4/2005 | Breger et al. | 702/117 |

| | | |
|---|---|---|
| 2003/0005359 A1 | 1/2003 | Magliocco |

FOREIGN PATENT DOCUMENTS

| | | |
|---|---|---|
| JP | 7-218602 | 8/1995 |
| JP | 2002 62340 A | 2/2002 |

OTHER PUBLICATIONS

Patent Abstracts of Japan, Publication No. 07-218602 dated Aug. 18, 1995, 1 pg.
Patent Abstracts of Japan; 2002-062340; Feb. 28, 2002; Toshiba Corporation (2 pages).
International Search Report based on PCT/JP2004/003456 mailed on Jul. 6, 2004 (2 pages).
Supplemental European Search Report issued in Application No. 04721004.2-2216, PCT/JP2004003456 mailed Mar. 6, 2006, 3 pages.

* cited by examiner

Primary Examiner—Marc S. Hoff
Assistant Examiner—Manuel Barbee
(74) Attorney, Agent, or Firm—Osha Liang LLP (57) ABSTRACT

A test apparatus for testing an electric device includes a plurality of signal input-output units for inputting and/or outputting test signals in response to each of a plurality of terminals included by the electric device, a channel selection memory for storing pieces of channel selection information indicating whether each of the signal input-output units should perform setting based on a setting condition or not, a setting condition memory for storing the setting condition with regard to the signal input-output unit, and a controlling means for retrieving and supplying the setting condition stored in the setting condition memory and the channel selection information stored in the channel selection memory to the signal input-output units based on a setting instruction, when receiving the setting instruction to set the setting condition of the signal input-output unit, wherein when at least one of the signal input-output units is selected by the channel selection information supplied from the controlling means, the one of the signal input-output units is set based on the setting condition supplied from the controlling means.

6 Claims, 4 Drawing Sheets

|    |   |   |   |   |     |
|----|---|---|---|---|-----|
| a1 | 1 | 1 | 1 | 1 | ... |
| a2 | 0 | 1 | 0 | 1 | ... |
| a3 | 0 | 0 | 0 | 1 | ... |
| ⋮  |   |   |   |   |     |

TEST APPARATUS AND SETTING METHOD THEREFOR

The present application is a continuation application of PCT/JP2004/03456 filed on Mar. 16, 2004 which claims priority from a Japanese patent application No. 2003-074898 filed on Mar. 19, 2003, the contents of which are incorporated herein by reference.

BACKGROUND OF THE INVENTION

1. Field of the Invention

The present invention relates to a test apparatus and a setting method therefor. More particularly, the present invention relates to a test apparatus for testing an electric device, and a setting method for setting a signal input-output unit included in the test apparatus.

2. Description of the Related Art

A conventional test apparatus instructs a test controlling unit to read setting conditions in response to test items from a disc device, and to transmit the setting conditions to a channel connected to an electric device in order to perform setting. Although such test apparatus repeatedly tests electric devices of the same type, it reads the setting conditions from the disc device, and transmits the setting conditions to the channel via a system bus each time it tests, and thus it takes the test apparatus much time to read data from the disc device and transmit the data.

Accordingly, in order to reduce the test time, it has been known a test apparatus includes an instruction analyzing unit for analyzing an instruction from the test controlling unit and setting the condition of a channel as disclosed, for example, in Japanese Patent Application Laid-open No. 1995-218602 (Patent Document 1). The test apparatus disclosed in this conventional art transmits and stores the setting condition of the disc device in a memory included in the instruction analyzing unit via the system bus prior to the test. And the test controlling unit transmits the setting condition to the instruction analyzing unit via the system bus to transmit and set the setting condition to the channel.

However, the test apparatus disclosed in the Patent Document 1 can only transmit the same setting condition to a plurality of channels, but not transmit different setting conditions to the channels, when setting the channels connected to one instruction analyzing unit. In addition, the test apparatus disclosed in Patent Document 1 cannot set or change the number of the condition data in response to the test items.

SUMMARY OF THE INVENTION

Therefore, it is an object of the present invention to provide a test apparatus and a setting method therefor, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a test apparatus for testing an electric device includes a plurality of signal input-output units for inputting and/or outputting test signals in response to each of a plurality of terminals included by the electric device, a channel selection memory for storing pieces of channel selection information indicating whether each of the signal input-output units should perform setting based on a setting condition or not, a setting condition memory for storing the setting condition with regard to the signal input-output unit, and a controlling means for retrieving and supplying the setting condition stored in the setting condition memory and the channel selection information stored in the channel selection memory to the signal input-output units based on a setting instruction, when receiving the setting instruction to set the setting condition of the signal input-output unit, wherein when at least one of the signal input-output units is selected by the channel selection information supplied from the controlling means, the one of the signal input-output units is set based on the setting condition supplied from the controlling means.

The setting condition memory may store the setting condition of the signal input-output unit and an address of the channel selection memory in a corresponding manner, and the controlling means may include a setting condition retrieving unit for retrieving the setting condition and the address of the channel selection memory from the setting condition memory, a selection information retrieving unit for retrieving the channel selection information from the channel selection memory based on the address of the channel selection memory retrieved by the setting condition retrieving unit, and a setting condition supplying unit for supplying the setting condition retrieved by the setting condition retrieving unit and the channel selection information retrieved by the selection information retrieving unit to the signal input-output units.

The setting condition retrieving unit may retrieve the setting condition including pieces of setting data and the addresses of the channel selection memory in response to each of the pieces of setting data from the setting condition memory, the selection information retrieving unit may retrieve pieces of the channel selection information from the channel selection memory based on the addresses of the channel selection memory retrieved by the setting condition retrieving unit, and the setting condition supplying unit may supply the pieces of setting data retrieved by the setting condition retrieving unit and the pieces of channel selection information retrieved by the selection information retrieving unit to the signal input-output units.

The setting condition memory may further store an address and size of the setting condition memory in a corresponding manner, and the setting condition retrieving unit may retrieve the address and size of the setting condition memory, and the pieces of setting data and the addresses of the channel selection memory as many as a number indicated by the retrieved size from the retrieved address of the setting condition memory.

The channel selection memory may store the channel selection information such that a flag "1" is held in response to the signal input-output unit to perform setting, whereas a flag "0" is held in response to the signal input-output unit not to perform setting, and the setting condition supplying unit may not supply the condition setting retrieved by the setting condition retrieving unit to the signal input-output units, when a logical sum of the flags held in the channel selection information retrieved by the selection information retrieving unit is "0".

The test apparatus may further include a plurality of test modules, each of which includes the plurality of signal input-output units, the channel selection memory, the setting condition memory, the setting condition retrieving unit, the selection information retrieving unit, and the setting condition supplying unit, and a test processor for supplying the test modules with the setting instruction to set the setting conditions of the signal input-output units, wherein the setting condition memories included respectively by the test modules may store different setting conditions in areas of a same address, the setting condition retrieving units may retrieve the different setting conditions respectively from the setting condition memories based on the address of the setting condition memory included by the setting instruction supplied from the test processor, and the setting condition supplying units may supply the setting conditions retrieved by the setting condition retrieving units respectively to the signal input-output units.

According to the second aspect of the present invention, a method for setting a setting condition of at least one of signal input-output units included by a test apparatus for inputting and/or outputting test signals in response to each of a plurality of terminals included by an electric device includes the steps of retrieving the setting condition of the signal input-output unit from a setting condition memory, retrieving channel selection information indicating whether each of the signal input-output units should perform setting based on the setting condition or not from a channel selection memory, supplying the setting condition retrieved from the setting condition memory and the channel selection information retrieved from the channel selection memory to the signal input-output units, and setting at least one of the signal input-output units based on the setting condition supplied, when the signal input-output unit is selected by the channel selection information supplied.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
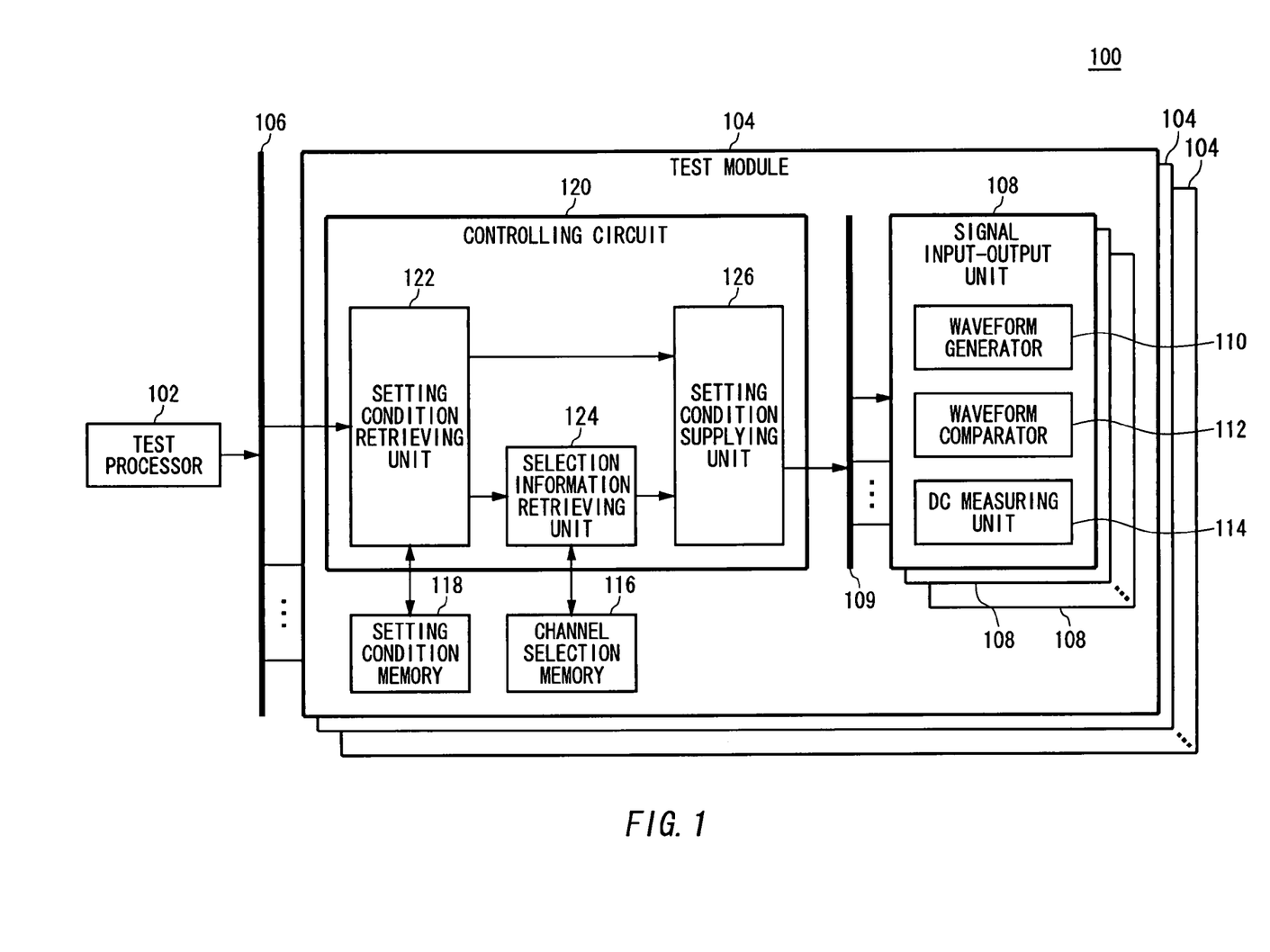
FIG. 1 shows an example of the configuration of a test apparatus 100 related to an exemplary embodiment of the present invention.

FIG. 1 shows an example of the configuration of a test apparatus 100 related to an exemplary embodiment of the present invention. The test apparatus 100 inputs a test signal to an electric device, and judges the quality of the electric device to test the electric device. The test apparatus 100 might change the setting of a waveform generator or waveform comparator in response to each of the test conditions in order to perform a variety of types of tests. Accordingly, it is an object of the test apparatus 100 in the present invention to reduce the setting time of the test conditions.

The test apparatus 100 includes a test processor 102 for generating a setting instruction to set a prescribed setting condition, and a plurality of test modules 104 for setting the setting condition based on the setting instruction generated by the test processor 102. The test processor 102 provides the setting instruction to a plurality of the test modules via a system bus 106 having a broadcast function. Each of the test modules 104 includes a plurality of signal input-output units 108 for inputting or outputting the test signals in response to each of a plurality of terminals included in the electric device, a channel selection memory 116 for storing a plurality of pieces of channel selection information which indicate whether each of the signal input-output units 108 performs setting based on the setting conditions or not, a setting condition memory 118 for storing both the setting conditions of the signal input-output units 108 and the logical addresses of the channel selection memory 116 in a corresponding manner, and a controlling circuit 120 for retrieving and supplying the channel selection information and the setting conditions to the signal input-output units 108 based on the setting instructions supplied from the test processor 102. The controlling circuit 120 which is an example of controlling means of this embodiment retrieves the setting conditions stored in the setting condition memory 118 and the channel selection information stored in the channel selection memory 116 based on the setting instruction, and supplies them to the signal input-output units 108 via the internal bus 109, when receiving the setting instruction to set the setting conditions of the signal input-output units 108.

Each of the signal input-output units 108 includes a waveform generator 110 for generating the test signal inputted to the electric device, a waveform comparator 112 for comparing the signal outputted from the electric device in response to the test signal inputted with an expected signal, and a DC measuring device 114 for measuring the DC voltage applied to the electric device or the DC voltage outputted by the electric device. In addition, the controlling circuit 120 includes a setting condition retrieving unit 122 for retrieving the setting conditions from the setting condition memory 118, a selection information retrieving unit 124 for retrieving the channel selection information from the channel selection memory 116, and a setting condition supplying unit 126 for supplying both the setting conditions retrieved by the setting condition retrieving unit 122 and the channel selection information retrieved by the selection information retrieving unit 124 to the signal input-output units 108.

The test processor 102 provides the test modules 104 with the setting instruction to set the setting conditions of the signal input-output units 108. The setting condition retrieving unit 122 receives the setting instruction including the logical addresses of the setting condition memory 118 from the test processor 102. When the setting condition retrieving unit 122 receives the setting instruction, it retrieves the setting conditions and the logical addresses of the channel selection memory 116 from the setting condition memory 118 based on the logical addresses of the setting condition memory 118 supplied from the test processor 102. And the selection information retrieving unit 124 retrieves the channel selection information from the channel selection memory 116 based on the logical addresses of the channel selection memory 116 retrieved by the setting condition retrieving unit 122. The setting condition supplying unit 126 supplies the signal input-output units 108 with both the setting conditions retrieved by the setting condition retrieving unit 122 and the channel selection information retrieved by the selection information retrieving unit 124.

Each of the signal input-output units 108 judges whether it is selected or not by the channel selection information supplied from the setting condition supplying unit 126. And if it is selected by the channel selection information, each of the signal input-output units 108 is set based on the setting conditions supplied from the setting condition supplying unit 126. Particularly, an applied voltage, test mode, test environment, etc. are set.

Figure 2:
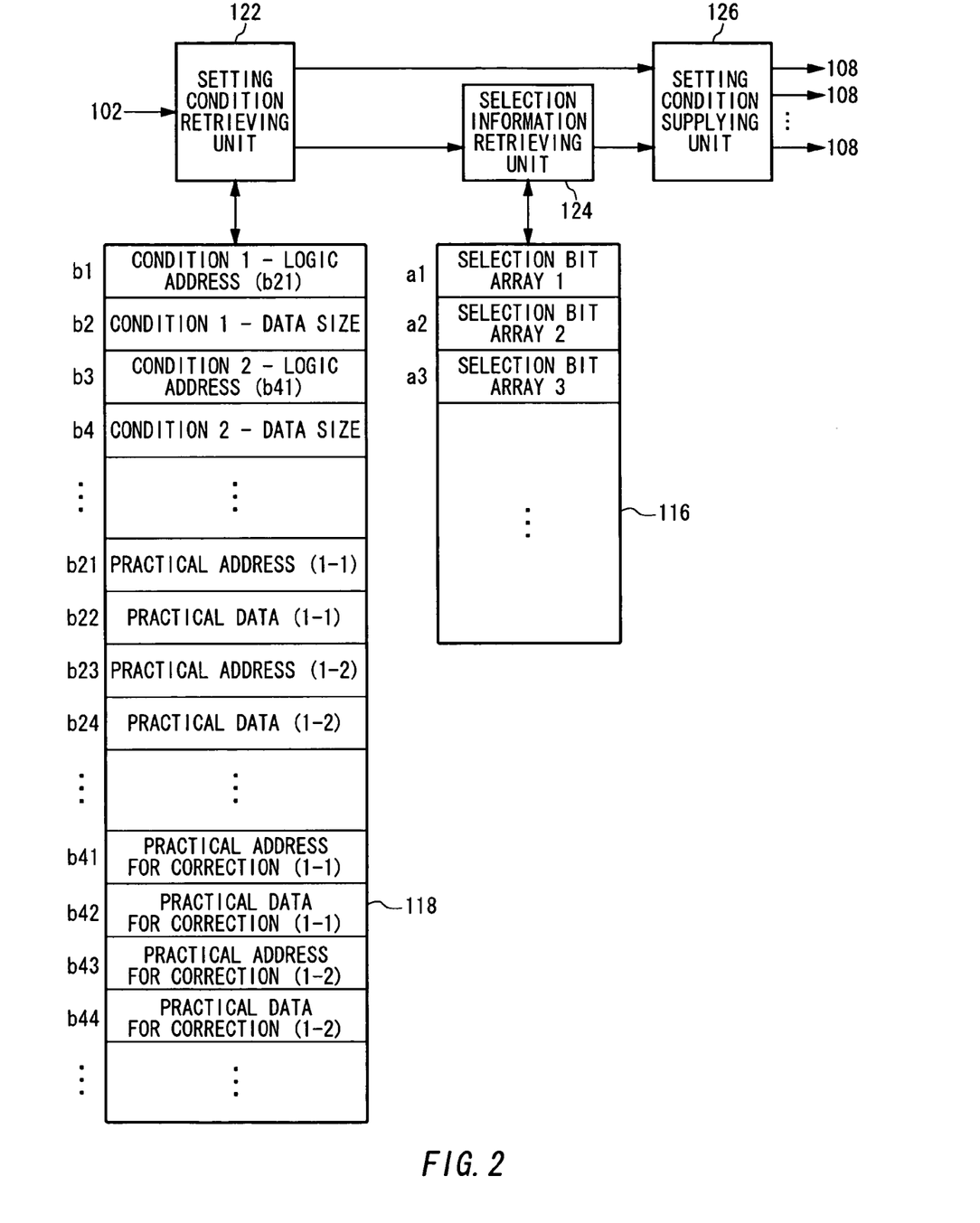
FIG. 2 shows an example of the data configuration of a setting condition memory 118 and a channel selection memory 116.

FIG. 2 shows an example of the data configuration of the setting condition memory 118 and the channel selection memory 116. The setting condition memory 118 includes a condition group assigning section (b1, b2, b3, b4 . . . ) for determining the storage locations of the setting conditions, a common condition recording section (b21, b22, b23, b24 . . . ) for storing the common setting conditions in response to the test modules 104, and a unique condition recording section (b41, b42, b43, b44 . . . ) for storing the different setting conditions in response to the test modules 104.

The setting condition memory 118 stores the logical address and the data size of the setting condition memory 118 correspondingly in the condition group assigning section. The combination of the logical address and the data size is prepared for each setting condition. Particularly, the setting condition memory 118 stores "Condition 1—Logical Address" and "Condition 1—Data Size", and "Condition 2—Logical Address" and "Condition 2—Data Size" correspondingly.

In addition, the setting condition memory 118 stores "Practical Address" and "Practical Data" correspondingly in the common condition recording section. The "Practical Address" includes the logical addresses of the channel selection memory 116 and setting addresses designated to setting places in the signal input-output units 108, and the "Practical Data" is setting data indicating the setting conditions. For example, the setting addresses designated to setting places in the signal input-output units 108 are the identification information of the DC measuring device, and the setting data indicating the setting conditions is the voltage applied. A plurality of the setting condition memories 118 included respectively in the test modules 104 store the common setting conditions in the areas of the same logical addresses as the "Practical Address" and "Practical Data".

And the setting condition memory 118 stores "Practical Address for Correction" and "Practical Data for Correction" correspondingly in the unique condition recording section. The "Practical Address for Correction" includes the logical addresses of the channel selection memory 116 and setting addresses designated to setting places in the signal input-output units 108, and the "Practical Data for Correction" is setting data indicating the setting conditions. A plurality of the setting condition memories 118 included respectively in the test modules 104 store the different setting conditions in response to each characteristic of the signal input-output units 108 included in the test modules 104 in the areas of the same logical addresses as the "Practical Address for Correction" and "Practical Data for Correction".

The setting condition retrieving unit 122 retrieves the logical address and the data size of the setting condition memory 118 from the setting condition memory 118. For example, it retrieves "Condition 1—Logical Address" and "Condition 1—Data Size". And the setting condition retrieving unit 122 retrieves the setting conditions including the setting data from the setting condition memory 118 and the logical addresses the channel selection memory 116 for each setting data. Particularly, the setting condition retrieving unit 122 retrieves the "Practical Address" and "Practical Data" as many as the number indicated by the retrieved data size from the logical addresses of the setting condition memory 118 retrieved. For example, if the "Condition 1—Data Size" is "4", it retrieves "Practical Address (1-1)", "Practical data (1-1)", "Practical Address (1-2)", and "Practical data (1-2)".

Then, the selection information retrieving unit 124 retrieves a plurality of pieces of the channel selection information from the channel selection memory 116 based on the logical addresses of the channel selection memory 116 included respectively in the practical addresses retrieved by the setting condition retrieving unit 122. For example, if the logical address of the channel selection memory 116 included in the "Practical Address (1-1)" is "a1", it retrieves "Selection Bit Array 1" which is the channel selection information, and if the logical address of the channel selection memory 116 included in the "Practical Address (1-2)" is "a2", it retrieves "Selection Bit Array 2" which is the channel selection information.

Then, the setting condition supplying unit 126 supplies both pieces of the setting data retrieved by the setting condition retrieving unit 122 and a plurality of the channel selection information retrieved by the selection information retrieving unit 124 to the signal input-output units 108. For example, it supplies the "Practical Address (1-1)", "Practical data (1-1)", and "Selection Bit Array 1" together with "Practical Address (1-2)", "Practical data (1-2)", and "Selection Bit Array 2" to the signal input-output units 108. When any of the signal input-output units 108 is selected by the "Selection Bit Array 1", it sets the setting place designated by the setting address included in the "Practical Address (1-1)" based on the "Practical data (1-1)".

Further, each of a plurality of setting condition retrieving units 122 may retrieve the "Practical Address for Correction" and "Practical Data for Correction" which are a plurality of different setting conditions respectively from a plurality of setting condition memories 118 based on the logical addresses of the setting condition memory 118 included in the setting instruction supplied from the test processor 102. And the setting condition supplying units 126 may supply the "Practical Address for Correction" and "Practical Data for Correction" which are a plurality of different setting conditions retrieved by each of the setting condition retrieving units 122 respectively to the signal input-output units 108. As above, since the setting condition memories 118 can store different setting conditions for each of the signal input-output units 108, the efficiency to utilize the memory can be improved.

Figure 3:
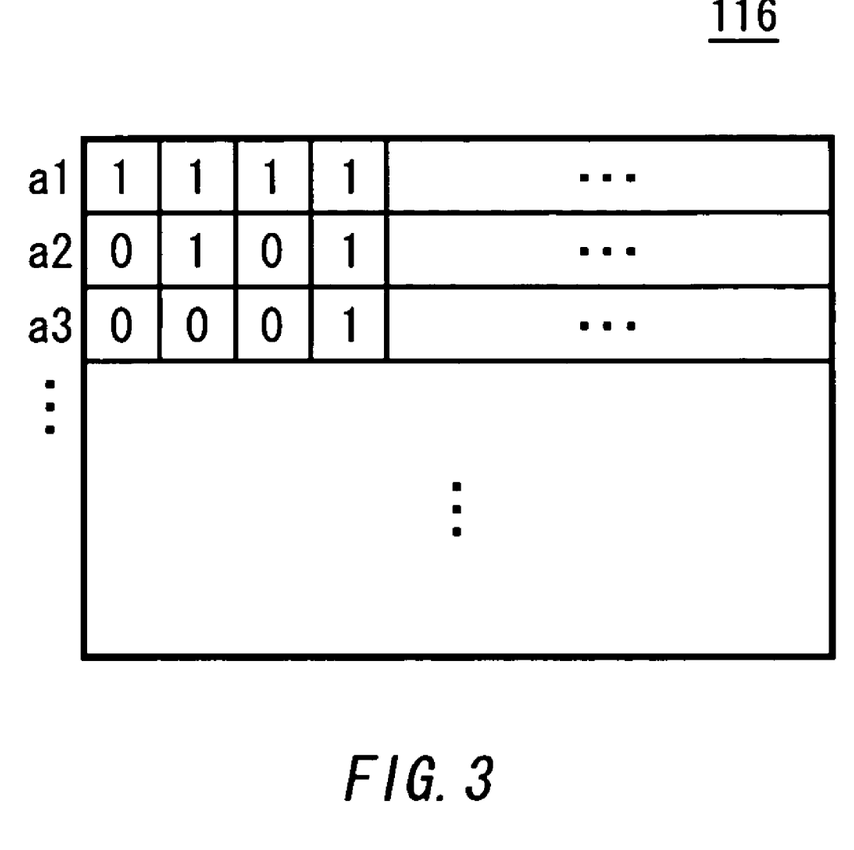
FIG. 3 shows an example of a selection bit array stored in a channel selection memory 116.

FIG. 3 shows an example of the selection bit array stored in the channel selection memory 116. The channel selection memory 116 stores the information indicating whether to set the signal input-output units 108 in a corresponding manner. For example, the channel selection memory 116 stores the channel selection information such that a flag "1" is held in response to the signal input-output units 108 to perform setting, whereas a flag "0" is held in response to the signal input-output units 108 not to perform setting.

The setting condition supplying unit 126 calculates the logical sum of the flags held by the channel selection information retrieved by the selection information retrieving unit 124. And if the logical sum calculated is "1", the setting condition supplying unit 126 supplies the setting conditions and the channel selection information to the signal input-output units 108. Meanwhile, if the logical sum calculated is "0", the setting condition supplying unit 126 does not supply the setting conditions and the channel selection information to the signal input-output units 108. In this way, since the setting condition supplying unit 126 discards in advance the setting conditions which will be discarded without being used by the signal input-output units 108, the amount of data transmitted through the internal bus 109 can be reduced.

Figure 4:
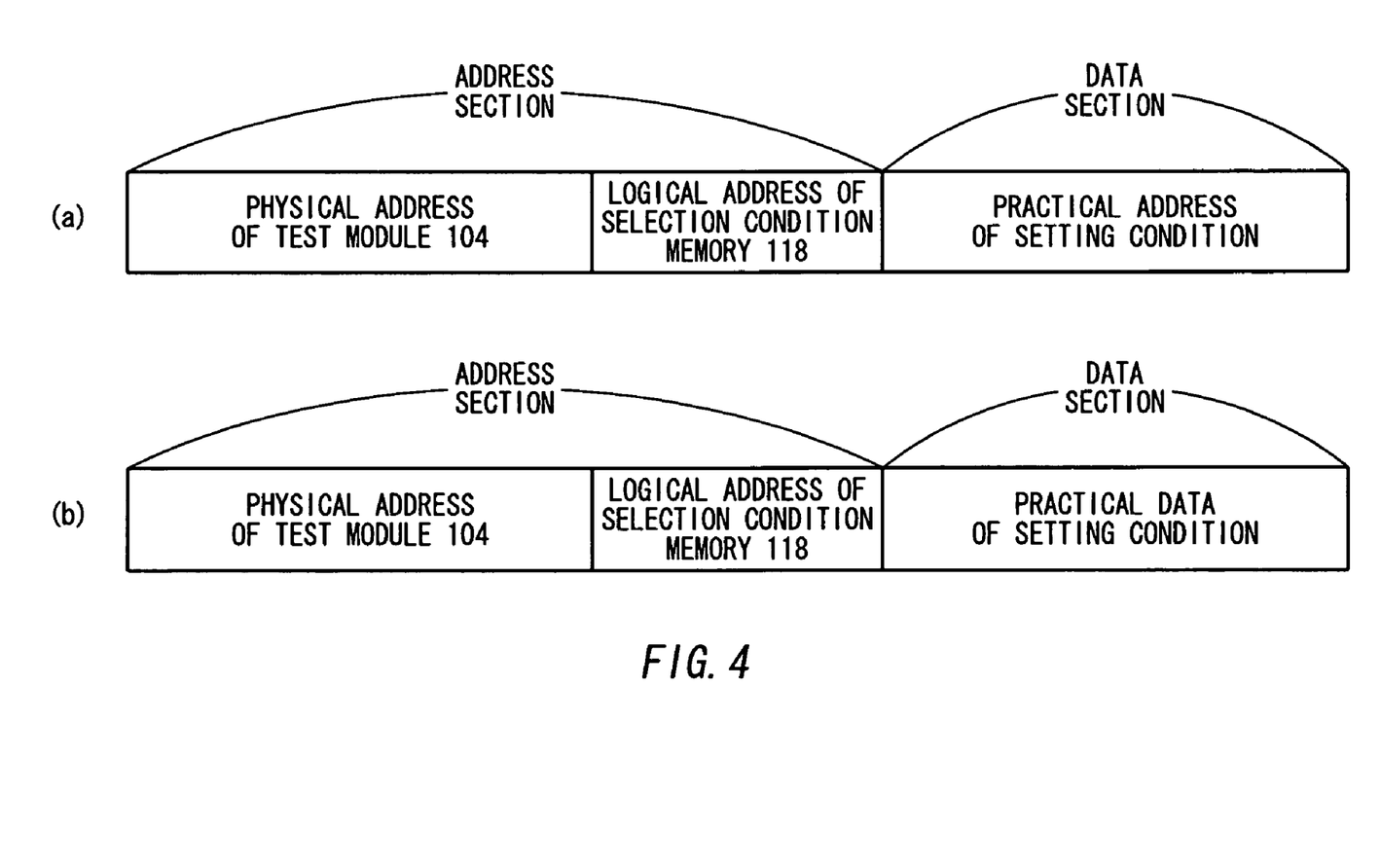
FIG. 4 shows an example of the data configuration of a writing instruction with regard to a common condition recording section of a setting condition memory 118 generated by a test processor 102.

FIG. 4 shows an example of the data configuration of a writing instruction with regard to the common condition recording section of the setting condition memory 118 generated by the test processor 102. The test processor 102 generates a writing instruction in response to one of the setting condition memories 118 of the test modules 104, before the test of the electric device starts, and writes the setting conditions stored in a disc device such as hard disc onto the common condition recording section of the setting condition memory 118 included in each of the test modules 104.

The test processor 102, as shown in FIG. 4(*a*), supplies the writing instruction to the setting condition memory 118 via the setting condition retrieving unit 122, where the writing instruction includes both an address section for holding the physical address of the test modules 104 and the logical address of the setting condition memory 118, and a data section for holding the practical address including the logical address of the channel selection memory 116 and the setting address of the setting place in the signal input-output units 108. In addition, the test processor 102, as shown in FIG. 4(*b*), supplies the writing instruction to the setting condition memory 118 via the setting condition retrieving unit 122, where the writing instruction includes both an address section for holding the physical address of the test modules 104 and the logical address of the setting condition memory 118, and a data section for holding the practical data which is the setting data indicating the setting conditions. The setting condition memory 118 holds the "Practical Address" including the logical address of the channel selection memory 116 and the setting address of the setting place in the signal input-output units 108 at the area of the logical address of the setting condition memory 118 of the test modules 104 designated by the address section shown in FIG. 4(*a*). In addition, the setting condition memory 118 holds the "Practical Data" which is the setting data indicating the setting conditions at the area of the logical address of the setting condition memory 118 of the test modules 104 designated by the address section shown in FIG. 4(*b*).

As above, since the setting conditions is stored in advance in the setting condition memories 118 included respectively in the test modules 104, the overhead of the time required to generate the writing instruction by the test processor 102 and the transmission time through the system bus 106 by the writing of the setting conditions can be curtailed. Accordingly, the entire test time can be reduced.

In addition, while the setting conditions are supplied from the setting condition memory 118 to the signal input-output units 108 so as to set the signal input-output units 108, the test processor 102 can perform other accesses such as the analysis of the test result. Accordingly, the test processes in parallel can be improved, and the entire test time can be reduced.

As obvious from the description above, according to the present invention, the test time can be reduced, and setting conditions which are different for each channel can be set.

Although the present invention has been described by way of exemplary embodiments, it should be understood that those skilled in the art might make many changes and substitutions without departing from the spirit and the scope of the present invention which is defined only by the appended claims.

What is claimed is:

1. A test module used in a test apparatus for testing an electric device, comprising:

a plurality of signal input-output units for: generating a test signal inputted to said electric device, comparing a signal outputted from said electric device in response to the test signal inputted with an expected signal, and inputting and/or outputting test signals in response to each of a plurality of terminals of said electric device when set according to a setting condition provided for performing a test;

a channel selection memory for storing pieces of channel selection information indicating whether each of said signal input-output units should perform a setting based on a setting condition in advance of starting the testing;

a setting condition memory for storing said setting condition with regard to said signal input-output unit in advance of starting the testing; and a controlling means for retrieving and supplying said setting condition stored in said setting condition memory and said channel selection information stored in said channel selection memory to said signal input-output units based on a setting instruction, when receiving said setting instruction to set said setting condition of said signal input-output unit, wherein when at least one of said signal input-output units is selected by said channel selection information supplied from said controlling means, said one of said signal input-output units is set based on said setting condition supplied from said controlling means, wherein said test module corresponds to said electric device having a unique test pattern, and wherein said setting condition memory stores said setting condition of said signal input-output unit and an address of said channel selection memory in a corresponding manner, and said controlling means comprises:

a setting condition retrieving unit for retrieving said setting condition and said address of said channel selection memory from said setting condition memory;

a selection information retrieving unit for retrieving said channel selection information from said channel selection memory based on said address of said channel selection memory retrieved by said setting condition retrieving unit; and a setting condition supplying unit for supplying said setting condition retrieved by said setting condition retrieving unit and said channel selection information retrieved by said selection information retrieving unit to said signal input-output units, wherein said setting condition retrieving unit retrieves said setting condition comprising pieces of setting data and said addresses of said channel selection memory in response to each of said pieces of setting data from said setting condition memory, said selection information retrieving unit retrieves pieces of said channel selection information from said channel selection memory based on said addresses of said channel selection memory retrieved by said setting condition retrieving unit, and said setting condition supplying unit supplies said pieces of setting data retrieved by said setting condition retrieving unit and said pieces of channel selection information retrieved by said selection information retrieving unit to said signal input-output units.

2. The test module used in a test apparatus as claimed in claim 1, wherein said setting condition memory further stores an address and size of said setting condition memory in a corresponding manner, and said setting condition retrieving unit retrieves said address and size of said setting condition memory from said setting condition memory and as many said pieces of setting data and said addresses of said channel selection memory as indicated by said retrieved size from said retrieved address of said setting condition memory.

3. A test module used in a test apparatus for testing an electric device, comprising:
a plurality of signal input-output units for: generating a test signal inputted to said electric device, comparing a signal outputted from said electric device in response to the test signal inputted with an expected signal, and inputting and/or outputting test signals in response to each of a plurality of terminals of said electric device when set according to a setting condition provided for performing a test;
a channel selection memory for storing pieces of channel selection information indicating whether each of said signal input-output units should perform a setting based on a setting condition in advance of starting the testing;
a setting condition memory for storing said setting condition with regard to said signal input-output unit in advance of starting the testing; and
a controlling means for retrieving and supplying said setting condition stored in said setting condition memory and said channel selection information stored in said channel selection memory to said signal input-output units based on a setting instruction, when receiving said setting instruction to set said setting condition of said signal input-output unit,
wherein when at least one of said signal input-output units is selected by said channel selection information supplied from said controlling means, said one of said signal input-output units is set based on said setting condition supplied from said controlling means,
wherein said test module corresponds to said electric device having a unique test pattern, and
wherein said setting condition memory stores said setting condition of said signal input-output unit and an address of said channel selection memory in a corresponding manner, and said controlling means comprises:
a setting condition retrieving unit for retrieving said setting condition and said address of said channel selection memory from said setting condition memory;
a selection information retrieving unit for retrieving said channel selection information from said channel selection memory based on said address of said channel selection memory retrieved by said setting condition retrieving unit; and
a setting condition supplying unit for supplying said setting condition retrieved by said setting condition retrieving unit and said channel selection information retrieved by said selection information retrieving unit to said signal input-output units,
wherein said channel selection memory stores said channel selection information such that a flag "1" is held when said signal input-output unit is to perform said setting, whereas a flag "0" is held when said signal input-output unit is not to perform said setting, and said setting condition supplying unit does not supply said condition setting retrieved by said setting condition retrieving unit to said signal input-output units, when a logical sum of said flags held in said channel selection information retrieved by said selection information retrieving unit is "0".

4. A testing apparatus for testing an electric device, comprising:
a test processor;
a bus;
a test module connecting with said test processor via said bus, comprising:
a plurality of signal input-output units for generating a test signal inputted to said electronic device, comparing a signal outputted from said electric device in response to the test signal inputted with an expected signal and inputting and/or outputting test signals in response to each of a plurality of terminals of said electric device when set according to a setting condition provided for performing a test;
a channel selection memory for storing pieces of channel selection information indicating whether each of said signal input-output units should perform a setting based on a setting condition in advance of starting the test;
a setting condition memory for storing said setting condition with regard to said signal input-output unit in advance of starting the test; and
a controlling means for retrieving and supplying said setting condition stored in said setting condition memory and said channel selection information stored in said channel selection memory to said signal input-output units based on a setting instruction, when receiving said setting instruction to set said setting condition of said signal input-output unit,
wherein when at least one of said signal input-output units is selected by said channel selection information supplied from said controlling means, said one of said signal input-output units is set based on said setting condition supplied from said controlling means,
wherein said test module corresponds to said electric device having a unique test pattern, and
wherein said setting condition memory stores said setting condition of said signal input-output unit and an address of said channel selection memory in a corresponding manner, and said controlling means comprises:
a setting condition retrieving unit for retrieving said setting condition and said address of said channel selection memory from said setting condition memory;
a selection information retrieving unit for retrieving said channel selection information from said channel selection memory based on said address of said channel selection memory retrieved by said setting condition retrieving unit; and
a setting condition supplying unit for supplying said setting condition retrieved by said setting condition retrieving unit and said channel selection information retrieved by said selection information retrieving unit to said signal input-output units,
wherein said setting condition retrieving unit retrieves said setting condition comprising pieces of setting data and said addresses of said channel selection memory in response to each of said pieces of setting data from said setting condition memory, said selection information retrieving unit retrieves pieces of said channel selection information from said channel selection memory based on said addresses of said channel selection memory retrieved by said setting condition retrieving unit, and said setting condition supplying unit supplies said pieces of setting data retrieved by said setting condition retrieving unit and said pieces of channel selection information retrieved by said selection information retrieving unit to said signal input-output units.

5. The test apparatus as claimed in claim 4, wherein said setting condition memory further stores an address and size of said setting condition memory in a corresponding manner, and said setting condition retrieving unit retrieves said address and size of said setting condition memory from said setting condition memory and as many said pieces of setting data and said addresses of said channel selection memory as indicated by said retrieved size from said retrieved address of said setting condition memory.

6. A testing apparatus for testing an electric device, comprising:

a test processor;

a bus;

a test module connecting with said test processor via said bus, comprising:

a plurality of signal input-output units for generating a test signal inputted to said electronic device, comparing a signal outputted from said electric device in response to the test signal inputted with an expected signal and inputting and/or outputting test signals in response to each of a plurality of terminals of said electric device when set according to a setting condition provided for performing a test;

a channel selection memory for storing pieces of channel selection information indicating whether each of said signal input-output units should perform a setting based on a setting condition in advance of starting the test;

a setting condition memory for storing said setting condition with regard to said signal input-output unit in advance of starting the test; and a controlling means for retrieving and supplying said setting condition stored in said setting condition memory and said channel selection information stored in said channel selection memory to said signal input-output units based on a setting instruction, when receiving said setting instruction to set said setting condition of said signal input-output unit, wherein when at least one of said signal input-output units is selected by said channel selection information supplied from said controlling means, said one of said signal input-output units is set based on said setting condition supplied from said controlling means, and wherein said test module corresponds to said electric device having a unique test pattern, and wherein said setting condition memory stores said setting condition of said signal input-output unit and an address of said channel selection memory in a corresponding manner, and said controlling means comprises:

a setting condition retrieving unit for retrieving said setting condition and said address of said channel selection memory from said setting condition memory;

a selection information retrieving unit for retrieving said channel selection information from said channel selection memory based on said address of said channel selection memory retrieved by said setting condition retrieving unit; and a setting condition supplying unit for supplying said setting condition retrieved by said setting condition retrieving unit and said channel selection information retrieved by said selection information retrieving unit to said signal input-output units, wherein said channel selection memory stores said channel selection information such that a flag "1" is held when said signal input-output unit is to perform said setting, whereas a flag "0" is held when said signal input-output unit is not to perform said setting, and said setting condition supplying unit does not supply said condition setting retrieved by said setting condition retrieving unit to said signal input-output units when a logical sum of said flags held in said channel selection information retrieved by said selection information retrieving unit is "0".

* * * * *